(12) United States Patent
Choi

(10) Patent No.: US 9,466,345 B2
(45) Date of Patent: Oct. 11, 2016

(54) SEMICONDUCTOR MEMORY DEVICE, METHOD OF OPERATING THE SAME AND MEMORY SYSTEM INCLUDING THE SAME

(71) Applicant: SK hynix Inc., Gyeonggi-do (KR)

(72) Inventor: Se Kyoung Choi, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 14/107,331

(22) Filed: Dec. 16, 2013

(65) Prior Publication Data

US 2015/0063047 A1    Mar. 5, 2015

(30) Foreign Application Priority Data

Sep. 2, 2013   (KR) .................. 10-2013-0104816

(51) Int. Cl.
| | |
|---|---|
| G11C 7/00 | (2006.01) |
| G11C 7/12 | (2006.01) |
| G11C 5/14 | (2006.01) |
| G11C 7/20 | (2006.01) |
| G11C 16/22 | (2006.01) |
| G11C 16/30 | (2006.01) |

(52) U.S. Cl.
CPC .............. *G11C 7/12* (2013.01); *G11C 5/148* (2013.01); *G11C 7/20* (2013.01); *G11C 16/225* (2013.01); *G11C 16/30* (2013.01)

(58) Field of Classification Search
USPC ........................................................ 365/203
See application file for complete search history.

(56) References Cited

U.S. PATENT DOCUMENTS

| | | | | |
|---|---|---|---|---|
| 8,953,383 | B2* | 2/2015 | Yoo .................... | G11C 16/0483 365/185.2 |
| 9,001,586 | B1* | 4/2015 | Yoo .................... | G11C 16/0483 365/185.11 |
| 2006/0039197 | A1* | 2/2006 | Khouri ................ | G11C 16/26 365/185.12 |
| 2008/0094927 | A1* | 4/2008 | Kim .................... | G11C 16/3427 365/204 |
| 2010/0182835 | A1* | 7/2010 | Chung ................ | G11C 16/08 365/185.11 |
| 2010/0214853 | A1* | 8/2010 | Kang .................. | G11C 5/147 365/189.07 |
| 2010/0301830 | A1* | 12/2010 | Wang .................. | G11C 16/30 323/311 |
| 2010/0302867 | A1* | 12/2010 | Koo .................... | G11C 5/147 365/185.25 |
| 2011/0267913 | A1* | 11/2011 | Chung ................ | G11C 7/12 365/203 |
| 2013/0038314 | A1* | 2/2013 | Nakashima ......... | H02M 3/158 323/304 |
| 2015/0023103 | A1* | 1/2015 | Aritome .............. | G11C 16/04 365/185.12 |
| 2015/0070987 | A1* | 3/2015 | Kim .................... | G11C 16/12 365/185.03 |
| 2015/0155047 | A1* | 6/2015 | Kim .................... | G11C 16/107 365/185.29 |

FOREIGN PATENT DOCUMENTS

KR    1020120033523    4/2012

* cited by examiner

*Primary Examiner* — Hoai V Ho
*Assistant Examiner* — Pablo Huerta
(74) *Attorney, Agent, or Firm* — IP & T Group LLP

(57) ABSTRACT

A semiconductor memory device according to an embodiment of the present invention includes a memory block, a driving circuit performing a program operation on memory cells and a voltage detector generating a detection signal when an external power supply voltage is reduced to less than a reference voltage level. The driving circuit discharges a voltage applied to a drain selection line during the program operation in response to the detection signal.

18 Claims, 7 Drawing Sheets

SEMICONDUCTOR MEMORY DEVICE, METHOD OF OPERATING THE SAME AND MEMORY SYSTEM INCLUDING THE SAME

CROSS-REFERENCE TO RELATED APPLICATION

The present application claims priority of Korean patent application number 10-2013-0104816, filed on Sep. 2, 2013, the entire disclosure of which is incorporated herein by reference in its entirety.

BACKGROUND

1. Field of Invention

Various exemplary embodiments of the present invention relate generally to an electronic device, and more particularly, to a semiconductor memory device, a method of operating the same and a memory system including the same.

2. Description of Related Art

A semiconductor memory device is a storage device that is realized using a semiconductor made from, for example, silicon (Si), germanium (Ge), gallium arsenide (GaAs) or indium phosphide (InP). Semiconductor memory devices may be classified into volatile memory devices and non-volatile memory devices.

Volatile memory devices are unable to retain the stored data when the power is off. Examples of the volatile memory devices may include Static Random Access Memory (SRAM), Dynamic RAM (DRAM) and Synchronous DRAM (SDRAM). Non-volatile memory devices can retain the stored data regardless of power on/off conditions. Examples of the non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change RAM (PRAM), Magnetic RAM (MRAM), Resistive RAM (RRAM) and Ferroelectric RAM (FRAM). Flash memories may be classified into NOR-type memories and NAND-type memories.

A semiconductor memory device operates by receiving an external power supply voltage to operate. When the external power supply voltage being supplied is suddenly interrupted, the semiconductor memory device stops operating. For example, when the supply of the external power supply voltage is cut off during a program operation, the semiconductor memory device may not complete the program operation properly.

SUMMARY

Exemplary embodiments of the present invention are directed to a semiconductor memory device having improved reliability, a method of operating the same and a memory system including the same.

A semiconductor memory device according to an embodiment of the present invention may include a memory block coupled to a drain selection line, a source selection line and a plurality of word lines arranged between the drain selection line and the source selection line, a driving circuit suitable for performing a program operation on memory cells coupled to a selected word line, among the plurality of word lines, using an external power supply voltage, and a voltage detector suitable for monitoring the external power supply voltage and generating a detection signal when the external power supply voltage is reduced to less than a reference voltage level, wherein the driving circuit discharges a voltage applied to the drain selection line during the program operation in response to the detection signal.

A method of operating a semiconductor memory device including a plurality of memory cells in groups, word lines corresponding to respective memory cells of the group, and bit lines corresponding to the respective groups of the memory cells according to another embodiment of the present invention may include generating an internal power supply voltage using an external power supply voltage, performing a program operation on memory cells coupled to a selected word line, among the word lines with data transferred through the bit lines, by using the internal power supply voltage, and disconnecting the respective groups of the memory cells from the bit lines when the external power supply voltage is reduced lower than a reference voltage level during the program operation.

A memory system according to yet another embodiment of the present invention may include a semiconductor memory device suitable for operating using an external power supply voltage, and a controller suitable for transmitting a program request to the semiconductor memory device, wherein the semiconductor memory device comprises a memory block comprising a plurality of memory cells in groups, word lines corresponding to respective memory cells of the group, and bit lines corresponding to the respective groups of the memory cells, a driving circuit suitable for performing a program operation on memory cells coupled to a selected word line, among the word lines, in response to the program request, and a voltage detector suitable for monitoring the external power supply voltage and generating a detection signal when the external power supply voltage is reduced lower than a reference voltage level, wherein while applying a voltage to a drain selection line to couple the respective groups of the memory cells to the bit lines during the program operation, the driving circuit discharges the voltage applied to the drain selection line in response to the detection signal.

A semiconductor memory device according to still another embodiment of the present invention may include a memory block comprising a plurality of memory cells in groups, word lines corresponding to respective memory cells of the group, and bit lines corresponding to the respective groups of the memory cells, a driving circuit suitable for performing a program operation on the memory cells using an external power supply voltage, and a voltage detector suitable for monitoring the external power supply voltage and generating a detection signal when the external power supply voltage is reduced lower than a reference voltage level, wherein while applying a voltage to a drain selection line to couple the respective groups of the memory cells to the bit lines during the program operation, driving circuit is suitable for discharging the voltage applied to the drain selection line in response to the detection signal.

DESCRIPTION OF EMBODIMENTS

Figure 1:
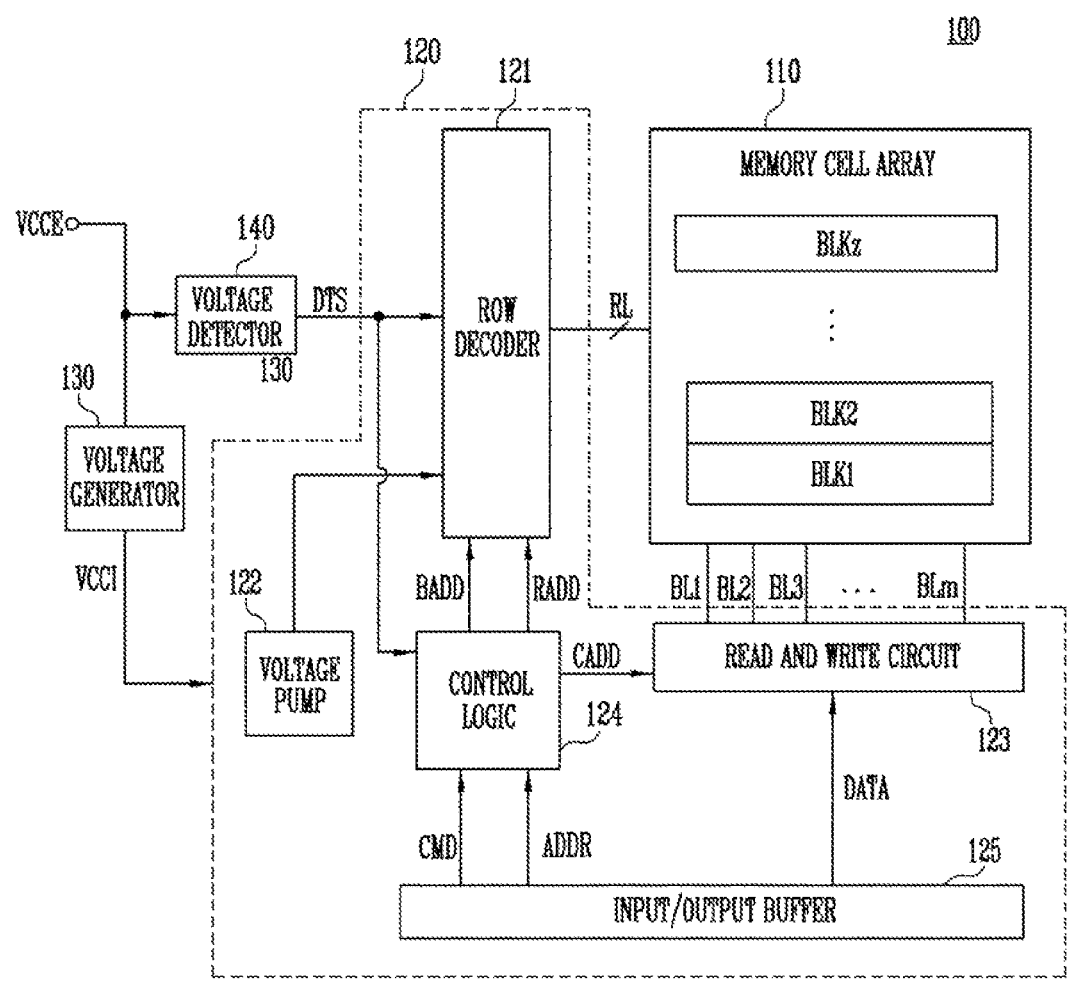
FIG. 1 is a block diagram illustrating a semiconductor memory device according to an embodiment of the present invention.

Hereinafter, various exemplary embodiments of the present invention will be described in detail with reference to the accompanying drawings. The figures are provided to enable those of ordinary skill in the art to make and use the present invention according to the exemplary embodiments of the present invention. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor memory device according to an embodiment of the present invention.

Referring to FIG. 1, a semiconductor memory device 100 may include a memory cell array 110, a driving circuit 120, a voltage generator 130, and a voltage detector 140.

The memory cell array 110 may include a plurality of memory blocks BLK1 to BLKz. The memory blocks BLK1 to BLKz may be coupled to a row decoder 121 of the driving circuit 120 through row lines RL (see reference characters DSL, LWL1 to LWLn and SSL in FIG. 2) and a read and write circuit 123 of the driving circuit 120 through bit lines BL.

The memory blocks BLK1 to BLKz may include a plurality of memory cells. According to an embodiment, a plurality of memory cells may be non-volatile memory cells.

The driving circuit 120 may include the row decoder 121, a voltage pump 122, the read and write circuit 123, a control logic 124, and an input/output buffer 125.

The row decoder 121 may be coupled to the memory blocks BLK1 to BLKz through the row lines RL. The row decoder 121 may be controlled by the control logic 124.

Addresses ADDR that are input during a program operation may include a block address BADD and a row address RADD. The row decoder 121 may receive the block address BADD and the row address RADD through the control logic 124.

The row decoder 121 may decode the block address BADD, among the addresses ADDR. The row decoder 121 may select one of the memory blocks BLK1 to BLKz in response to the decoded block address BADD.

The row decoder 121 may decode the row address RADD, among the addresses ADDR. The row decoder 121 may select one of local word lines of a selected memory block in response to the decoded row address RADD. For example, the row decoder 121 may apply a program voltage having a high voltage level to a selected local word line and apply a pass voltage to unselected local word lines. The program and pass voltages are input from the voltage pump 122.

The voltage pump 122 may be controlled by the control logic 124. The voltage pump 122 may generate a plurality of voltages by using an internal power supply voltage VCCI that is input from the voltage generator 130. For example, the voltage pump 122 may include a plurality of pumping capacitors that receive the internal power supply voltage VCCI. In addition, the voltage pump 122 may generate a plurality of voltages by selectively activating the pumping capacitors under control of the control logic 124. For example, the voltage pump 122 may generate a program voltage and a pass voltage during a program operation.

The read and write circuit 123 may be coupled to the memory cell array 110 through the bit lines BL1 to BLm. The read and write circuit 123 may be controlled by the control logic 124.

The read and write circuit 123 may receive the column address CADD, among the addresses ADDR, from the control logic 124, and decode the column address CADD.

The read and write circuit 123 may communicate data DATA with the input/output buffer 125. During a program operation, the read and write circuit 123 may receive the data DATA to be programmed through the input/output buffer 125. In addition, the read and write circuit 123 may transfer the data DATA to the bit lines BL1 to BLm corresponding to the decoded column address CADD. The read and write circuit 123 may apply a program enable voltage (e.g., ground voltage) to a bit line coupled to first memory cells, among selected memory cells coupled to the selected local word line, thereby increasing the threshold voltages of the first memory cells. The read and write circuit 123 may apply a program inhibit voltage (e.g., internal power supply voltage) to a bit line coupled to second memory cells other than the first memory cells, among the selected memory cells, thereby maintaining the threshold voltages of the second memory cells. Therefore, the selected memory cells may be programmed with the data DATA.

According to an embodiment, the read and write circuit 123 may include a column selection circuit and page buffers (or page registers).

The control logic 124 may receive a command CMD, indicating, for example, a program operation, through the input/output buffer 125. The control logic 124 may control the row decoder 121, the voltage pump 122, the read and write circuit 123, and the input/output buffer 125 in response to the command CMD.

The control logic 124 may receive the addresses ADDR through the input/output buffer 125. The control logic 124 may transfer the block address BADD and the row address RADD, among the addresses ADDR, to the row decoder 121, and transfer the column address CADD, among the addresses ADDR, to the read and write circuit 123.

The input/output buffer 125 may be controlled by the control logic 124. The input/output buffer 125 may receive the command CMD, the addresses ADDR and the data DATA from exterior. The input/output buffer 125 may transfer the command CMD and the addresses ADDR to the control logic 124 and transfer the data DATA to the read and write circuit 123.

The voltage generator 130 may generate the internal power supply voltage VCCI by using a power supply voltage that is input from exterior (hereinafter, "external power supply voltage VCCE"). For example, the voltage generator 130 may generate the internal power supply voltage VCCI by regulating the external power supply voltage VCCE. The internal power supply voltage VCCI may be provided to the driving circuit 120 and used as an operating voltage for the row decoder 121, the voltage pump 122, the read and write circuit 123, the control logic 124 and the input/output buffer 125.

The voltage generator 130 may properly generate the internal power supply voltage VCCI when the external power supply voltage VCCE falls within a predetermined voltage range. On the other hand, the voltage generator 130 may be unable to generate the proper internal power supply voltage VCCI when a voltage level of the external power supply voltage VCCE is lower than the predetermined voltage level. When the proper internal power supply voltage VCCI is not provided to the driving circuit 120, the semiconductor memory device 100 may not operate properly. For example, when the voltage level of the external power supply voltage VCCE falls within the predetermined voltage range, the semiconductor memory device 100 may be defined as a normal operation state. When the voltage level of the external power supply voltage VCCE is lower than the predetermined voltage level, the semiconductor memory device 100 may be defined as a power-off state.

When the external power supply voltage VCCE being supplied is suddenly cut off (sudden power off), that is, the voltage level of the external power supply voltage VCCE suddenly drops to be lower than the predetermined voltage range, the internal power supply voltage VCCI may be discharged, and lines coupled to a selected memory block may also be discharged. Since voltages being applied to local word lines of the selected memory block may be higher than those of other lines (e.g., bit lines) coupled to the selected memory block, these voltages may be discharged relatively slowly. As a result, selected memory cells may be inadvertently programmed due to the effects of these high voltages through the local word lines for a predetermined amount of time.

The voltage detector 140 may monitor the external power supply voltage VCCE and may generate a detection signal DTS when the external power supply voltage VCCE is reduced lower than a reference voltage level. The reference voltage level may fall within the predetermined voltage range. The voltage detector 140 may detect a sudden power off and may generate the detection signal DTS before it occurs.

The driving circuit 120 may discharge a voltage being applied to a drain selection line of the selected memory block in response to the detection signal DTS during a program operation. Therefore, the program operation of the selected memory cells may be prohibited.

According to an embodiment, an unrequested increase in threshold voltages of the selected memory cells may be prevented in the event of sudden power off. Therefore, reliability of the program operation may be improved.

Figure 2:
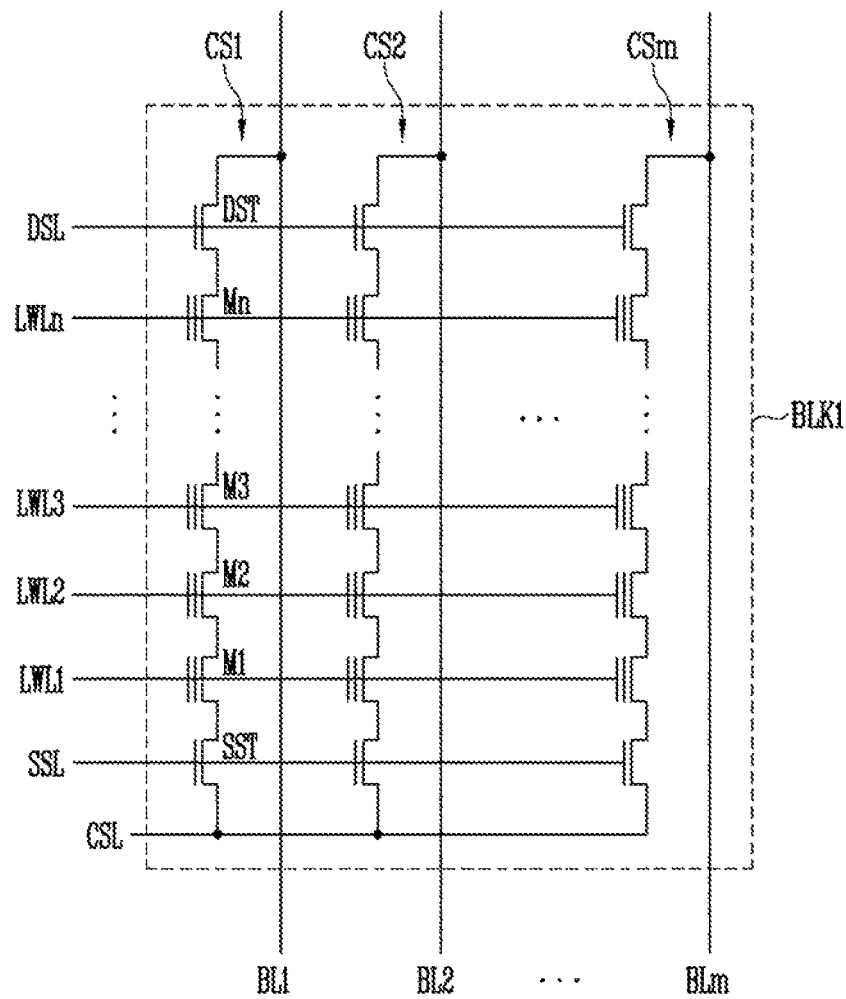
FIG. 2 is a circuit diagram illustrating one of a plurality of memory blocks shown in FIG. 1.

FIG. 2 is a circuit diagram illustrating the first memory block BLK1, among the memory blocks BLK1 to BLKz shown in FIG. 1.

The first memory block BLK1 may include first to m-th cell strings CS1 to CSm. The first to m-th cell strings CS1 to CSm may be coupled to the first to m-th bit lines BL1 to BLm, respectively. The first to m-th cell strings CS1 to CSm may be coupled to a common source line CSL, a source selection line SSL, first to n-th local word lines LWL1 to LWLn, and a drain selection line DSL.

Each of the cell strings CS1 to CSm may include a source selection transistor SST, memory cells M1 to Mn and a drain selection transistor DST that are coupled in series. The source selection transistor SST may be coupled to the source selection line SSL. The first to n-th memory cells M1 to Mn may be coupled to the first to n-th local word lines LWL1 to LWLn, respectively. The drain selection transistor DST may be coupled to the drain selection line DSL. A source terminal of the source selection transistor SST may be coupled to the common source line CSL. A drain terminal of the drain selection transistor DST may be coupled to a corresponding bit line. The source selection line SSL, the first to n-th local word lines LWL1 to LWLn and the drain selection line DSL may be included in the row lines RL shown in FIG. 1.

The source selection line SSL, the first to n-th local word lines LWL1 to LWLn and the drain selection line DSL may be controlled by the row decoder 121. For example, the common source line CSL may be controlled by the control logic 124.

During a program operation, a memory block other than the first memory block BLK1 may be selected from the memory blocks BLK1 to BLKz shown in FIG. 1. A drain non-selection voltage (e.g., ground voltage) may be applied to the drain selection line DSL of the first memory block BLK1. Therefore, the cell strings CS1 to CSm may be electrically disconnected from the bit lines BL1 to BLm, and voltages of channels of the cell strings CS1 to CSm may be boosted when voltages of the local word lines LWL1 to LWLn increase. As a result, the memory cells of the first memory block BLK1 may not be programmed.

When the first memory block BLK1 is selected from the memory block BLK1 to BLKz shown in FIG. 1 during a program operation, a drain selection voltage (e.g., internal power supply voltage) may be applied to the drain selection line DSL of the first memory block BLK1. The first to m-th cell strings CS1 to CSm may be electrically connected to corresponding bit lines through the drain selection transistors DST. A pass voltage having a high voltage level may be applied to unselected local word lines (e.g., LWL2 to LWLn), among the local word lines LWL1 to LWLn. A program voltage having a higher voltage level than the pass voltage may be applied to a selected local word line (e.g., LWL1). For example, a ground voltage may be applied to the source selection line SSL.

The drain selection transistors DST of the cell strings CS1 to CSm may be turned on by the drain selection voltage transferred through the drain selection line DSL. The data DATA, which is transferred through the bit lines BL1 to BLm, may be programmed into the selected memory cells through the drain selection transistors DST.

For example, when a program enable voltage (e.g., ground voltage) is applied to a bit line, the program enable voltage may be transferred to a channel of a corresponding cell string through the drain selection transistor DST. A threshold voltage of a corresponding memory cell may increase due to a difference between the program voltage of the selected local word line and the program enable voltage of the channel.

For example, when the program inhibit voltage (e.g., internal power supply voltage) is applied to the bit line, the drain selection transistor DST may be turned off when the voltage of the channel of the corresponding cell string is increased higher than a value obtained by subtracting the threshold voltage of the drain selection transistor DST from the drain selection voltage (e.g., internal power supply voltage). Therefore, the voltage of the channel of the corresponding cell string may also be boosted in line with increases in a pass voltage Vpass and a program voltage Vpgm that are applied to the local word lines LWL1 to LWLn. As a result, the threshold voltage of the corresponding memory cell may not increase.

During a program operation, a sudden power-off may occur in which the external power supply voltage VCCE, shown in FIG. 1, is suddenly cut off. Since the program enable voltage or the program inhibit voltage, which is a relatively low voltage, is applied to the bit lines BL1 to BLm, the bit lines BL1 to BLm may be discharged in a short time. On the other hand, since the program voltage Vpgm or the pass voltage Vpass, which is a relatively high voltage, is applied to the local word lines LWL1 to LWLn, it may take more time to discharge the local word lines LWL1 to LWLn.

Therefore, the voltages of the local word lines LWL1 to LWLn may have greater voltage levels than a predetermined level, while the program inhibit voltage applied to the bit line has already been discharged. Since the voltages of the bit lines reach the program enable voltage corresponding to the ground voltage, the program enable voltage may be transferred to the channels of the cell strings, and threshold voltages of the selected memory cells may be increased due to a difference between the program voltage, which is applied through the selected local word line, and the program enable voltage, which is transferred to the channel of the cell strings. This phenomenon may also be affected by a voltage variation of the drain selection line DSL. For example, when the drain selection line DSL that was receiving the drain selection voltage (e.g., internal power supply voltage) before sudden power-off occurs is discharged relatively slowly during the sudden power-off, the program enable voltage of the bit lines may be more easily transferred to the channel of the cell strings. Therefore, the threshold voltages of the selected memory cells may further increase.

As a result, the threshold voltages of the selected memory cells may inadvertently increase in the event of sudden power-off, and thus reliability of the program operation may be reduced.

Figure 3:
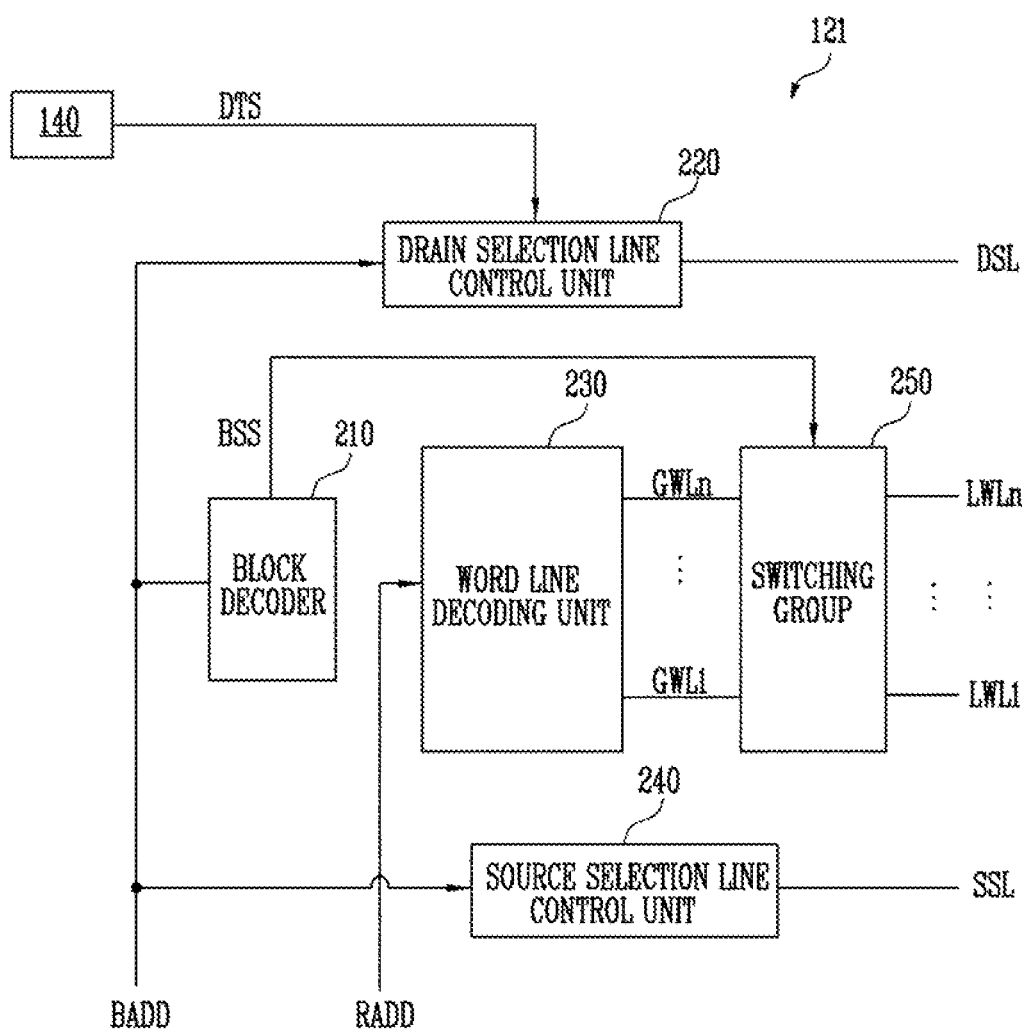
FIG. 3 is a block diagram illustrating a row decoder coupled to the memory block, shown in FIG. 2, in detail.

FIG. 3 is a block diagram illustrating the row decoder 121 coupled to the memory block BLK1 shown in FIG. 2.

Referring to FIG. 3, the row decoder 121 may include a block decoder 210, a drain selection line control unit 220, a word line decoding unit 230, a source selection line control unit 240, and a switching group 250.

The block decoder 210, the drain selection line control unit 220 and the source selection line control unit 240 may operate in response to the block address BADD. The block decoder 210 may enable or disable a block selection signal BSS in response to the block address BADD. The block selection signal BSS may be transferred to the switching group 250.

The drain selection line control unit 220 may bias the drain selection line DSL to turn on or off the drain selection transistor DST, shown in FIG. 2, in response to the block address BADD. The drain selection line control unit 220 may include a switching device that applies a drain selection voltage or a drain non-selection voltage to the drain selection line DSL.

The word line decoding unit 230 may apply the program voltage Vpgm or the pass voltage Vpass to first to n-th global word lines GWL1 to GWLn in response to the row address RADD.

The switching group 250 may couple the first to n-th global word lines GWL1 to GWLn to the first to n-th local word lines LWL1 to LWLn, respectively, in response to the block selection signal BSS inputted from the block decoder 210.

The source selection line control unit 240 may control the voltage of the source selection line SSL in response to the block address BADD. For example, the source selection line control unit 240 may apply the ground voltage to the source selection line SSL during the program operation.

According to an embodiment, the drain selection line control unit 220 may discharge the drain selection line DSL in response to the detection signal DTS inputted from the voltage detector 140. For example, the drain selection line control unit 220 may apply the drain non-selection voltage to the drain selection line DSL in response to the detection signal DTS.

The detection signal DTS may be generated when the external power supply voltage VCCE is reduced to less than the reference voltage level. Since the reference voltage level falls within a voltage range in which the semiconductor memory device 100, shown in FIG. 1, performs a normal operation, the drain selection line control unit 220 may operate normally when the detection signal DTS is transferred. Therefore, the drain selection line DSL may be discharged.

Figure 4:
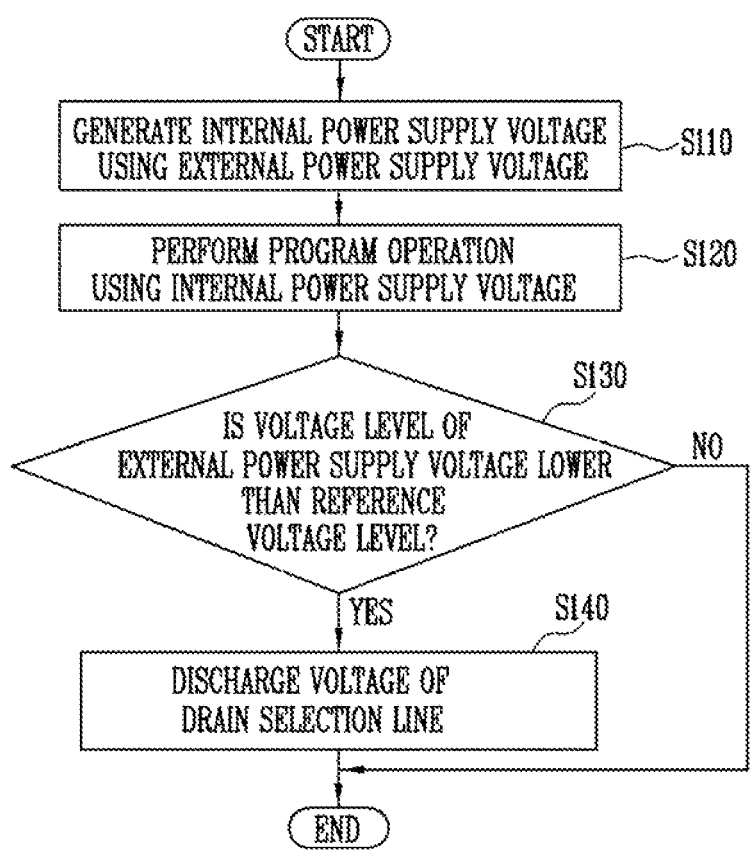
FIG. 4 is a flowchart illustrating a method of operating a semiconductor memory device according to an embodiment of the present invention.

FIG. 4 is a flowchart illustrating a method of operating the semiconductor memory device 100 according to an embodiment of the present invention.

Referring to FIGS. 1, 2 and 4, at step S110, the internal power supply voltage VCCI may be generated using the external power supply voltage VCCE. At step S120, when a program request is input, a program operation may be performed on the selected memory cells of the selected memory block using the internal power supply voltage VCCI.

It may be detected whether the voltage level of the external power supply voltage VCCE is lower than the predetermined reference voltage level at step S130. When the voltage level of the external power supply voltage VCCE is lower than the reference voltage level, step S140 may be performed.

The voltage of the drain selection line DSL may be discharged at step S140. In other words, when the voltage level of the external power supply voltage VCCE is lower than the reference voltage level, the voltage of the drain selection line DSL may be discharged before the external power supply voltage VCCE is further reduced to cause the semiconductor memory device to enter a power off mode and be unable to control voltages applied to the selected memory block.

Figure 5:
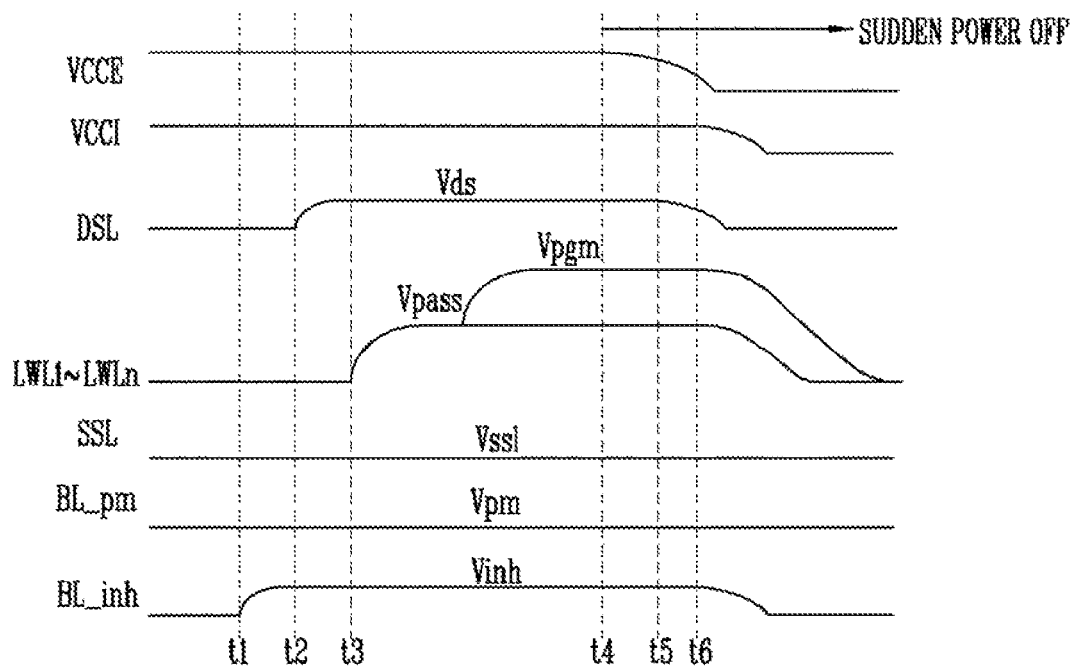
FIG. 5 is a timing diagram illustrating a method of operating a semiconductor memory device in detail.
Figure 6:
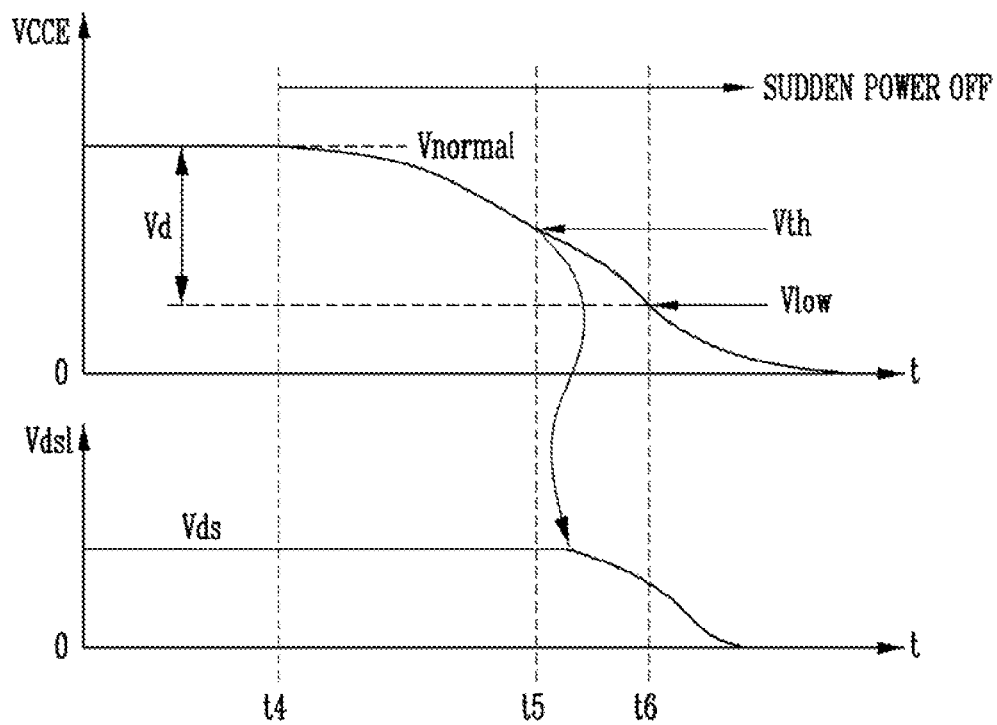
FIG. 6 is a detailed graph illustrating an external power supply voltage and a voltage of a drain selection line at fourth to sixth times shown in FIG. 5.

FIG. 5 is a timing diagram illustrating a method of operating the semiconductor memory device 100 in detail. FIG. 6 is a detailed graph illustrating the external power supply voltage VCCE and a voltage Vdsl of the drain selection line DSL at fourth to sixth times t4 to t6 shown in FIG. 5.

Referring to FIG. 5, a program enable voltage Vpm (e.g., ground voltage) may be applied to a bit line BL_pm coupled to a memory cell to be programmed at a first time t1. A program inhibit voltage Vinh (e.g., internal power supply voltage) may be applied to a bit line BL_inh coupled to a memory cell to be program-inhibited.

At a second time t2, a drain selection voltage Vds may be applied to the drain selection line DSL. First to m-th cell strings CS1 to CSm may be electrically coupled to the bit lines BL1 to BLm shown in FIG. 2. A source selection line voltage Vssl may be applied to the source selection line SSL.

At a third time t3, the program voltage Vpgm may be applied to a selected local word line and the pass voltage Vpass may be applied to unselected local word lines, among the local word lines LWL1 to LWLn. Therefore, the selected memory cells may be programmed depending on whether the corresponding bit line has the program inhibit voltage Vinh or the program enable voltage Vpm.

At a fourth time t4, the external power supply voltage VCCE may start to decrease. At a fifth time t5, the drain selection voltage Vds, which is applied to the drain selection line DSL, may start to be discharged when the external power supply voltage VCCE reaches the reference voltage level. This will be described in detail below with reference to FIG. 6.

Referring to FIG. 6, the external power supply voltage VCCE may maintain a normal voltage level Vnormal and start to decrease at the fourth time t4. The external power supply voltage VCCE may reach a reference voltage level Vth at the fifth time t5 and further decrease to reach a minimum voltage level Vlow at the sixth time t6. The external power supply voltage VCCE may be reduced to a ground voltage.

When the voltage level of the external power supply voltage VCCE is lower than the minimum voltage level Vlow, the semiconductor memory device 100 shown in FIG. 1 may be defined as a power-off state. When the external power supply voltage VCCE ranges between the normal voltage level Vnormal and the minimum voltage level Vlow, the semiconductor memory device 100 may be defined as a normal operation state. The voltage level of the external power supply voltage VCCE may sharply decrease after the fourth time t4. A phenomenon in which the voltage level of the external power supply voltage VCCE sharply decreases may be defined as sudden power off.

According to an embodiment of the present invention, the drain selection line DSL of the selected memory block may maintain the drain selection voltage Vdsl and subsequently the drain selection voltage Vdsl may be discharged at the fifth time t5 when the external power supply voltage VCCE reaches the reference voltage level Vth, as shown in FIG. 6. In other words, the drain selection transistor DST, shown in FIG. 2, coupled to the drain selection line DSL may be turned off when the external power supply voltage VCCE is lower than the reference voltage level Vth.

Referring again to FIG. 5, the internal power supply voltage VCCI may be relatively stably generated until the external power supply voltage VCCE reaches the minimum voltage level Vlow. When the external power supply voltage VCCE is reduced to less than the minimum voltage level Vlow after the sixth time t6, the internal power supply voltage VCCI may be reduced.

As the internal power supply voltage VCCI decreases, the program inhibit voltage Vinh may be discharged to reach a ground voltage. In addition, the program voltage Vpgm and the pass voltage Vpass, which are generated in the voltage pump 122, may also be reduced to reach a ground voltage. A time taken for the program voltage Vpgm and the pass voltage Vpass, which are high voltages, to decrease may be greater than a time for the program inhibit voltage Vinh to decrease. In other words, even when the program inhibit voltage Vinh is reduced to reach a ground voltage, i.e., the same level as the program enable voltage Vpm, the program voltage Vpgm and the pass voltage Vpass may still maintain high voltages. However, according to an embodiment of the present invention, since a voltage of the drain selection line DSL is discharged before the program inhibit voltage Vinh decreases, the bit lines BL1 to BLm, shown in FIG. 2, and the cell strings CS1 to CSm, shown in FIG. 2, may be electrically disconnected from each other, and the cell strings CS1 to CSm may be floated. Therefore, the memory cells may be prevented from being programmed in error.

Figure 7:
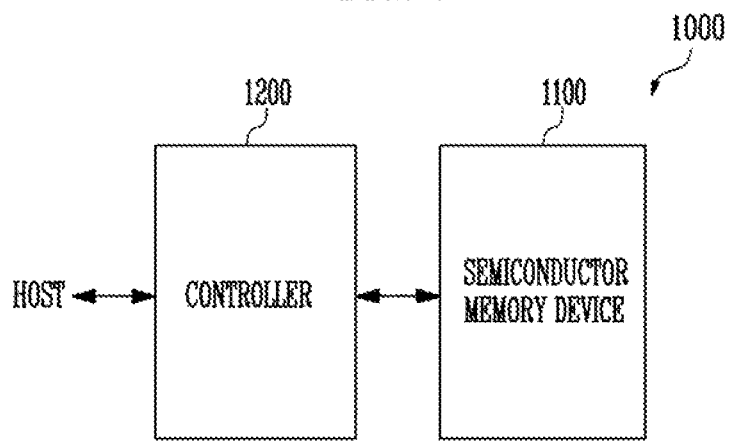
FIG. 7 is a block diagram illustrating a memory system including a semiconductor memory device according to an embodiment of the present invention.

FIG. 7 is a block diagram illustrating a memory system 1000 including a semiconductor memory device 1100.

Referring to FIG. 7, the memory system 1000 may include the semiconductor memory device 1100 and a controller 1200.

The semiconductor memory device 1100 may be configured and operated in the same manner as the semiconductor memory device 100 described above with reference to FIG. 1. Hereinafter, a description of common contents with earlier described embodiments is omitted.

The controller 1200 may be coupled to a host and the semiconductor memory device 1100. The controller 1200 may access the semiconductor memory device 1100 in response to a request from the host. For example, the controller 1200 may control read, write, erase and background operations of the semiconductor memory device 1100. The controller 1200 may provide an interface between the semiconductor memory device 1100 and the host. The controller 1200 may drive firmware for controlling the semiconductor memory device 1100.

The controller 1200 may include various components such as a random access memory (RAM), a processing unit, a host interface, a memory interface and an error correcting code (ECC) block. The RAM may function as at least one of an operation memory of the processing unit, a cache memory between the semiconductor memory device and the host, and a buffer memory between the semiconductor memory device and the host. The processing unit may control the general operation of the controller 1200.

The host interface may include a protocol for data exchange between the host and the controller 1200. According to an exemplary embodiment, the controller 1200 may communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol. The memory interface may interface with the semiconductor memory device 1100. For example, the memory interface may include at least one of flash interfaces, such as a NAND interface and a NOR interface.

The controller 1200 may include an ECC block that detects and corrects an error in data inputted from the semiconductor memory device 1100 by using an error correcting code (ECC).

The controller 1200 and the semiconductor memory device 1100 may be integrated into a single semiconductor device. In an embodiment, the controller 1200 and the semiconductor memory device 1100 may be integrated into a single semiconductor device to form a memory card. For example, the controller 1200 and the semiconductor memory device 1100 may be integrated into a single semiconductor device to form a memory card, such as PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 1200 and the semiconductor memory device 1100 may be integrated into a single semiconductor device to form a semiconductor drive (Solid State Drive (SSD)). The semiconductor drive (SSD) may include a storage device that stores data in a semiconductor memory.

When the memory system 1000 is used as the semiconductor drive (SSD), an operating speed of the host coupled to the memory system 1000 may be significantly improved.

In another example, the memory system 1000 may be used as one of various components of an electronic device, such as a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, computer network, or telematics network, an RFID device and/or one of various devices for computing systems, etc.

In an exemplary embodiment, the semiconductor memory device 1100 or the memory system 1000 may be packaged in a variety of ways. For example, in some embodiments, the semiconductor memory device 1100 or the memory system 1000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flatpack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP) and/or a wafer-level processed stack package (WSP), etc.

Figure 8:
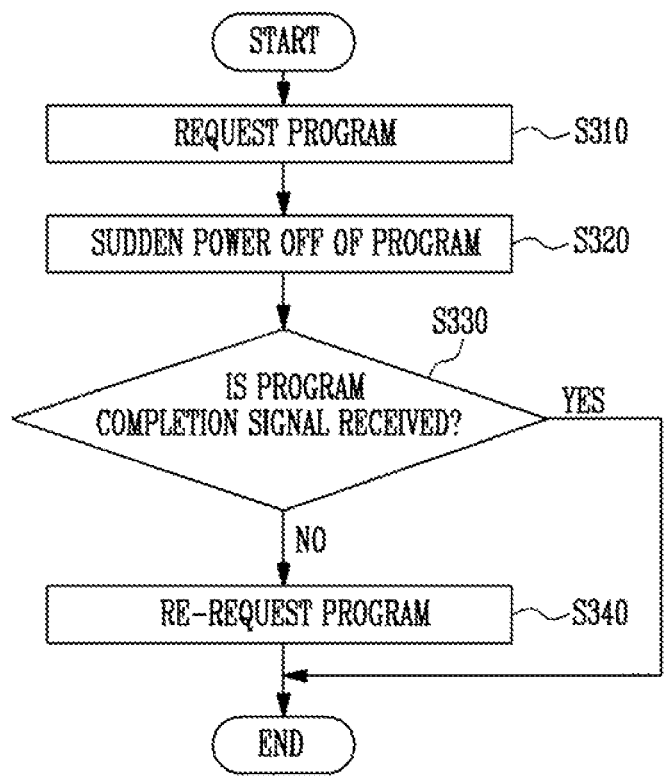
FIG. 8 is a flowchart illustrating a method of operating a controller shown in FIG. 7.

FIG. 8 is a flowchart illustrating a method of operating the controller 1200 shown in FIG. 7.

Referring to FIGS. 7 and 8, at step S310, the controller 1200 may send a program request to the semiconductor memory device 1100 under control of the host. In other words, the controller 1200 may output the command CMD indicating a program operation, the addresses ADDR, and the data DATA, shown in FIG. 1, to the semiconductor memory device 1100.

The semiconductor memory device 1100 may perform the program operation in response to the program request. In addition, the semiconductor memory device 1100 may transmit a program completion signal to the controller 1200 when the external power supply voltage VCCE, shown in FIG. 1, is properly provided, and the program operation is completed in response to the program request. When the program operation in response to the program request is not properly completed due to a sudden power-off, the program completion signal may not be transmitted.

At step S320, a sudden power-off may occur. The external power supply voltage VCCE may sharply decrease and reach a ground voltage through the minimum voltage level Vlow, shown in FIG. 6.

At step S330, the controller 1200 may determine whether or not the program completion signal is input when the external power supply voltage VCCE is provided again. When the program completion signal is not input, step S340 may be performed.

At step S340, the controller 1200 may re-transmit the program request to the semiconductor memory device 1100.

Therefore, even when a sudden power-off occurs during a program operation, the corresponding program operation may be performed again if the external power supply voltage VCCE is provided again.

Figure 9:
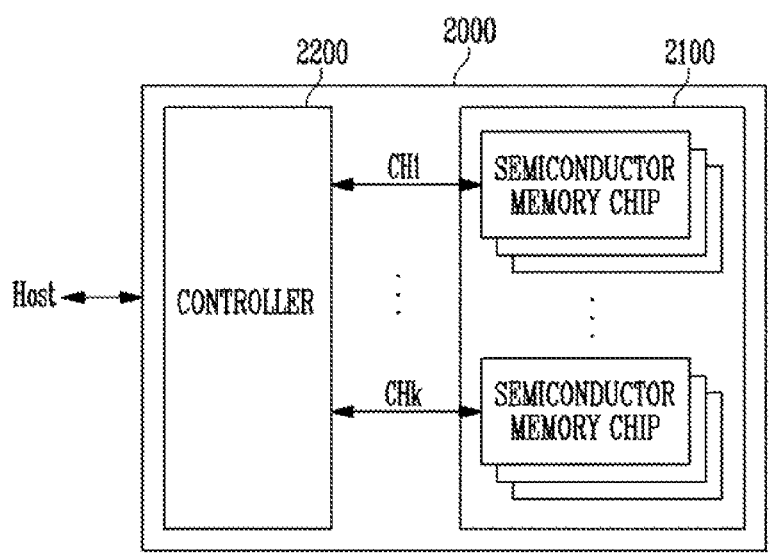
FIG. 9 is a block diagram illustrating an application example of the memory system shown in FIG. 7.

FIG. 9 is a block diagram illustrating an application example 2000 of the memory system 1000 shown in FIG. 7.

Referring to FIG. 9, a memory system 2000 may include a semiconductor memory device 2100 and a controller 2200. The semiconductor memory device 2100 may include a plurality of semiconductor memory chips. The plurality of semiconductor memory chips may be divided to a plurality of groups.

As illustrated in FIG. 9, the plurality of groups may communicate with the controller 2200 through first to k-th channels CH1 to CHk. Each of the semiconductor chips may be configured and operated in substantially the same manner as the semiconductor memory device 100 as described above with reference to FIG. 1.

Each of the groups may communicate with the controller 2200 through a single common channel. The controller 2200 may have substantially the same configuration as the controller 1200 described above with reference to FIG. 7 and may control the plurality of memory chips of the semiconductor memory device 2100 through the first to k-th channels CH1 to CHk.

As illustrated in FIG. 9, the plurality of semiconductor memory chips may be coupled to a single channel. However, the memory system 2000 may be modified so that a single memory chip may be coupled to a single channel.

Figure 10:
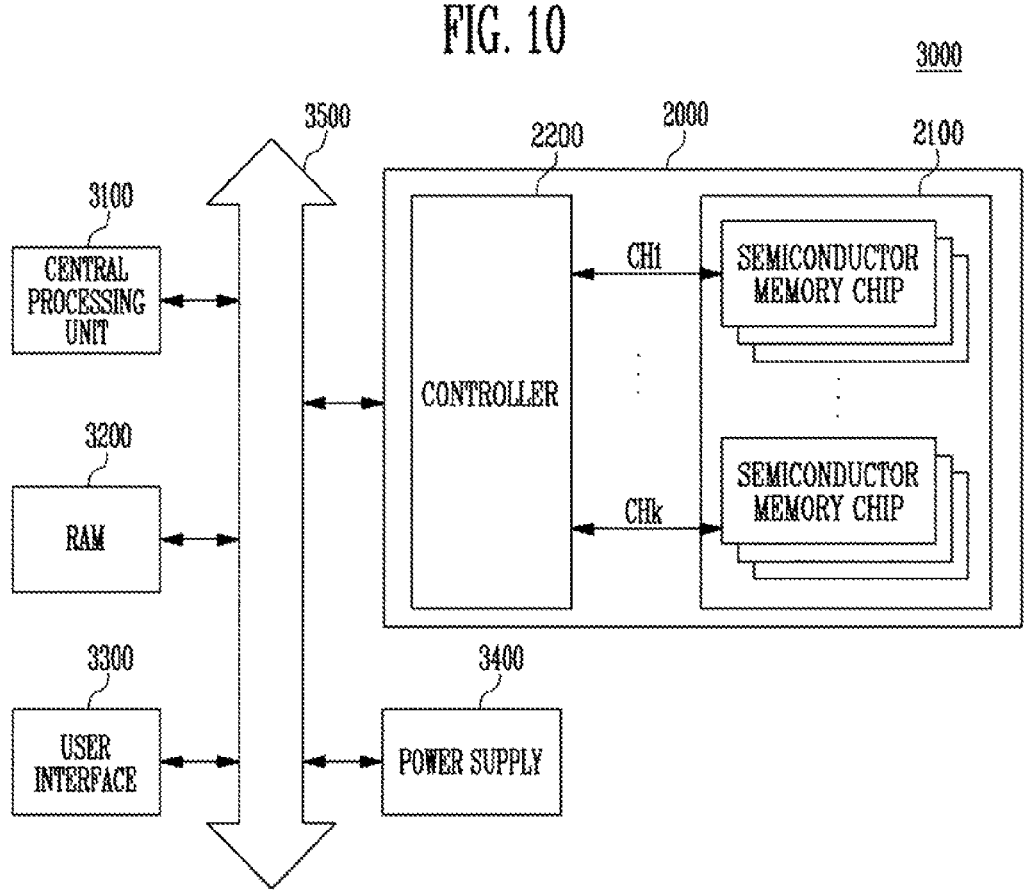
FIG. 10 is a block diagram illustrating a computing system including the memory system according to an embodiment of the present invention.

FIG. 10 is a block diagram illustrating a computing system 3000 that includes the memory system 2000 described above with reference to FIG. 9.

Referring to FIG. 10, the computing system 3000 may include a central processing unit (CPU) 3100, a random access memory (RAM) 3200, a user interface 3300, a power supply 3400, a system bus 3500 and a memory system 2000.

The memory system 2000 may be electrically connected to the CPU 3100, the RAM 3200, the user interface 3300 and the power supply 3400 through the system bus 3500. The memory system 2000 may store data that is provided through the user interface 3300 or processed by the CPU 3100.

The external power supply voltage VCCE, shown in FIG. 1, may be provided to the semiconductor memory device 2100 from the power supply 3400. When the power supply 3400 is unexpectedly removed from the computing system 3000, a sudden power off may occur. According to an embodiment of the present invention, memory cells may be prevented from unrequested programming during the sudden power off.

As illustrated in FIG. 10, the semiconductor memory device 2100 may be coupled to the system bus 3500 through the controller 2200. However, the semiconductor memory device 2100 may be directly coupled to the system bus 3500. Functions of the controller 2200 may be performed by the CPU 3100 and the RAM 3200.

As illustrated in FIG. 10, the memory system 2000, described above with reference to FIG. 9, may be provided. However, the memory system 2000 may be replaced by the memory system 1000 described above with reference to FIG. 7. According to an embodiment, the computing system 3000 may include both memory systems 1000 and 2000 described above with reference to FIGS. 7 and 9.

According to embodiments of the present invention, a semiconductor memory device having improved reliability, a method of operating the same and a memory system including the same are provided.

As described above, the exemplary embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device operating by receiving an external power voltage, the semiconductor memory device comprising:
    a memory block coupled to a drain selection line, a source selection line and a plurality of word lines arranged between the drain selection line and the source selection line;
    a driving circuit suitable for performing a program operation on memory cells coupled to a selected word line, among the plurality of word lines;
    a voltage detector suitable for monitoring the external power supply voltage and generating a detection signal when the external power supply voltage is reduced to less than a reference voltage level; and
    a voltage generator suitable for receiving the external power supply voltage and generating an internal power supply voltage,
    wherein the driving circuit discharges a voltage applied to the drain selection line of the memory block performing the program operation when the external power supply voltage is detected to be less than the reference voltage level, during the program operation,
    wherein the voltage generator generates the internal power supply voltage of a target level when the external power supply voltage is between a first voltage level and a second voltage level, and the reference voltage level is lower than the first voltage level and higher than the second voltage level.

2. The semiconductor memory device of claim 1, wherein the internal power supply voltage is supplied to the driving circuit.

3. The semiconductor memory device of claim 1, wherein the driving circuit includes a row decoder controlling the drain selection line, the source selection line and the plurality of word lines.

4. The semiconductor memory device of claim 3, wherein the row decoder biases the drain selection line to turn on drain selection transistors coupled to the drain selection line in response to a block address during the program operation, and
    the row decoder discharges the drain selection line in response to the detection signal.

5. The semiconductor memory device of claim 1, wherein the memory block comprises:
    drain selection transistors coupled in common to the drain selection line;
    source selection transistors coupled in common to the source selection line; and
    a multiplicity of memory cells in groups, wherein the group of memory cells are arranged between the drain selection transistor and the source selection transistor and coupled to the plurality of word lines, respectively.

6. The semiconductor memory device of claim 5, wherein the respective groups of the memory cells are coupled to bit lines through the drain selection transistors,
    the driving circuit includes a read and write circuit coupled to the bit lines, and
    the memory cells coupled to the selected word line are programmed by data transferred through the bit lines from the read and write circuit when the drain selection transistors are turned on.

7. The semiconductor memory device of claim 6, wherein the drain selection transistors are turned off when the detection signal is generated.

8. A method of operating a semiconductor memory device including a plurality of memory cells in groups, word lines corresponding to respective memory cells of the group, and bit lines corresponding to the respective groups of the memory cells, the method comprising:
    generating an internal power supply voltage using an external power supply voltage;
    performing a program operation on memory cells coupled to a selected word line, among the word lines with data transferred through the bit lines, by using the internal power supply voltage; and
    disconnecting the respective groups of the memory cells from the bit lines when the external power supply voltage is reduced lower than a reference voltage level during the program operation.

9. The method of claim 8, wherein the internal power supply voltage is generated to have a target level when the external power supply voltage is between a first voltage level and a second voltage level, and
    the reference voltage level is lower than the first voltage level and higher than the second voltage level.

10. The method of claim 9, wherein the semiconductor memory device is defined as a normal state when the external power supply voltage is between the first voltage level and the second voltage level, and
    the semiconductor memory device is defined as a power-off state when the external power supply voltage is lower than the second voltage level.

11. The method of claim 8, wherein the performing of the program operation comprises turning on drain selection transistors coupled between the groups of the memory cells and the bit lines, respectively, and
    the disconnecting of the groups of the memory cells from the bit lines comprises turning off the drain selection transistors.

12. The method of claim 11, wherein the disconnecting of the groups of the memory cells from the bit lines further comprising:
    generating a detection signal when the external power supply voltage is lower than the reference voltage level; and
    discharging a voltage applied to a drain selection line, to which the drain selection transistors coupled in common, in response to the detection signal.

13. A memory system, comprising:
    a semiconductor memory device; and
    a controller suitable for transmitting a program request to the semiconductor memory device,
    wherein the semiconductor memory device comprises:
    a memory block coupled to a drain selection line, a source selection line and a plurality of word lines arranged between the drain selection line and the source selection line;
    a driving circuit suitable for performing a program operation on memory cells coupled to a selected word line, among the plurality of word lines, in response to the program request; and a voltage detector monitoring an external power supply voltage; and a voltage generator generating an internal power supply voltage by receiving the external power supply voltage, wherein the driving circuit discharges a voltage applied to the drain selection line of the memory block performing the program operation when the external power supply voltage is monitored to be lower than a reference voltage level, during the program operation, wherein the voltage generator generates the internal power supply voltage of a target level when the external power supply voltage is between a first voltage level and a second voltage level, and the reference voltage level is lower than the first voltage level and higher than the second voltage level.

14. The memory system of claim 13, wherein the semiconductor memory device transmits a program completion signal to the controller when the external power voltage is normally provided and the program operation is completed.

15. The memory system of claim 14, wherein the controller re-transmits the program request to the semiconductor memory device, depending on whether or not the program completion signal is input, when the external power supply voltage is provided after the external power supply voltage is cut off.

16. The memory system of claim 13, wherein
the driving circuit operates using the internal power supply voltage.

17. The memory system of claim 13, wherein the voltage detector generates a detection signal when the external power supply voltage is reduced to lower than the reference voltage level, and
the driving circuit discharges the voltage applied to the drain selection line in response to the detection signal.

18. The memory system of claim 17, wherein the memory block comprises:
memory cells coupled to the plurality of word lines; and
drain selection transistors coupled in common to the drain selection line between the memory cells and bit lines,
wherein the drain selection transistors are turned off in response to the detection signal while the drain selection transistors are turned on to program the memory cells coupled to the selected word line.

* * * * *